(12) United States Patent
Kim et al.

(10) Patent No.: US 12,345,767 B2
(45) Date of Patent: Jul. 1, 2025

(54) APPARATUS AND METHOD FOR MEASURING CAPACITY OF BATTERY CELL

(71) Applicant: LG ENERGY SOLUTION, LTD., Seoul (KR)

(72) Inventors: Young Min Kim, Daejeon (KR); Cheol Taek Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 119 days.

(21) Appl. No.: 17/790,604

(22) PCT Filed: Jul. 7, 2021

(86) PCT No.: PCT/KR2021/008617
§ 371 (c)(1),
(2) Date: Jul. 1, 2022

(87) PCT Pub. No.: WO2022/019532
PCT Pub. Date: Jan. 27, 2022

(65) Prior Publication Data
US 2023/0073815 A1   Mar. 9, 2023

(30) Foreign Application Priority Data
Jul. 21, 2020   (KR) ................. 10-2020-0090055

(51) Int. Cl.
*G01R 31/374* (2019.01)
*G01R 31/382* (2019.01)
(Continued)

(52) U.S. Cl.
CPC ......... *G01R 31/374* (2019.01); *G01R 31/382* (2019.01); *G01R 31/396* (2019.01);
(Continued)

(58) Field of Classification Search
CPC ........................... G01R 31/374; G01R 31/396
See application file for complete search history.

(56) References Cited

U.S. PATENT DOCUMENTS

2009/0200987 A1   8/2009   Saito et al.
2010/0243346 A1   9/2010   Anderson et al.
(Continued)

FOREIGN PATENT DOCUMENTS

CN   106461386 A   2/2017
CN   111279536 A   6/2020
(Continued)

OTHER PUBLICATIONS

KR-101974945 B1 Machine Translation, retrieved from KIPO, original document published 2019.*
(Continued)

*Primary Examiner* — Minh Q Phan
(74) *Attorney, Agent, or Firm* — Morgan, Lewis & Bockius LLP

(57) ABSTRACT

The present technology relates to an apparatus for measuring a capacity of a battery cell, and a method of measuring a capacity of a battery cell. The apparatus includes: a jig configured to have a battery cell mounted thereon and press the battery cell from both surfaces; a charge/discharge unit configured to be connected to the battery cell; and a charge/discharge chamber configured to accommodate the jig and the battery cell, wherein a thermoelectric element for adjusting a temperature of the battery cell is formed on an external surface of the jig.

18 Claims, 10 Drawing Sheets

(51) Int. Cl.
*G01R 31/396* (2019.01)
*H01M 10/42* (2006.01)
*H02J 7/00* (2006.01)
*H10N 10/80* (2023.01)

(52) U.S. Cl.
CPC ....... *H01M 10/4285* (2013.01); *H02J 7/0048* (2020.01); *H10N 10/80* (2023.02)

(56) References Cited

U.S. PATENT DOCUMENTS

| | | | |
|---|---|---|---|
| 2011/0232302 | A1 | 9/2011 | Dallinger et al. |
| 2017/0074634 | A1 | 3/2017 | Yoon et al. |
| 2020/0150061 | A1 | 5/2020 | Kriele |
| 2023/0063883 | A1* | 3/2023 | Hong .................. H01M 50/204 |

FOREIGN PATENT DOCUMENTS

| | | |
|---|---|---|
| DE | 10-2008-042135 A1 | 3/2010 |
| JP | 2010-067502 A | 3/2010 |
| KR | 10-2008-0113240 A | 12/2008 |
| KR | 10-2016-0058516 A | 5/2016 |
| KR | 10-1639210 B1 | 7/2016 |
| KR | 10-2018-0100748 A | 9/2018 |
| KR | 10-2018-0122116 A | 11/2018 |
| KR | 101974945 B1 * | 5/2019 |
| KR | 10-2019-0069882 A | 6/2019 |
| KR | 10-2020-0042044 A | 4/2020 |

OTHER PUBLICATIONS

International Search Report (with partial translation) and Written Opinion dated Nov. 2, 2021 issued in corresponding International Patent Application No. PCT/KR2021/008617.

Extended European Search Report dated Sep. 13, 2023 in corresponding European Patent Application No. 21845487.4.

Xu Qun et al., "Study on high and low temperature performance of ternary cylindrical power lithium-ion battery" Journal of Lianyungang Vocational and Technical College, ISSN: 1009-4318, vol. 3 No.1, Mar. 30, 2018.

Office Action dated Apr. 18, 2025 issued in the corresponding Chinese Patent Application No. 202180007863.X with the English translation. (Note: US 2010/0243346 A1, JP 2010-067502 A, and KR 2018-0122116 A previously filed.).

* cited by examiner

[FIG. 1]
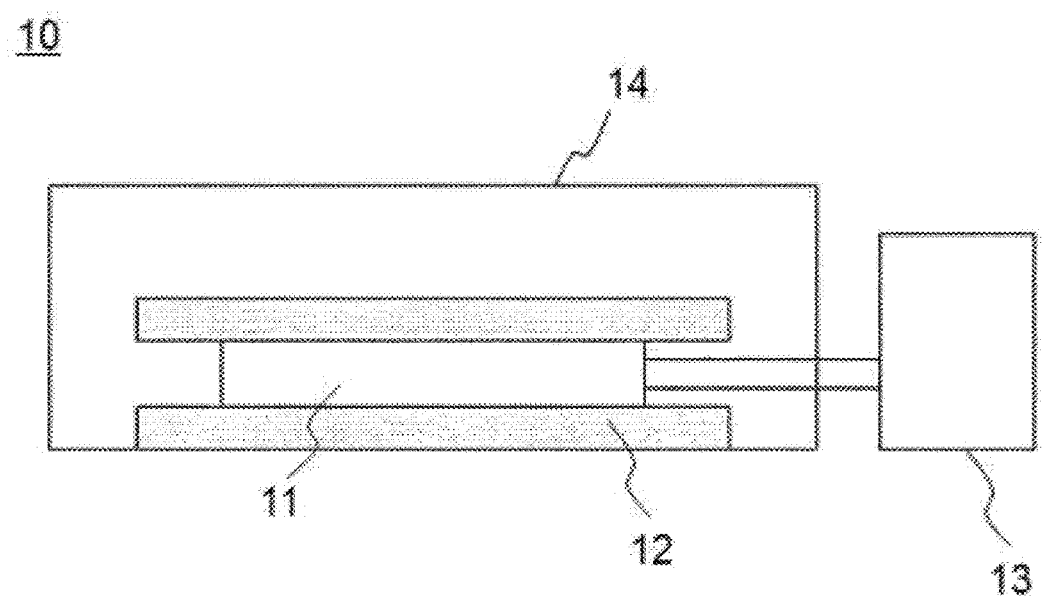

[FIG. 2]
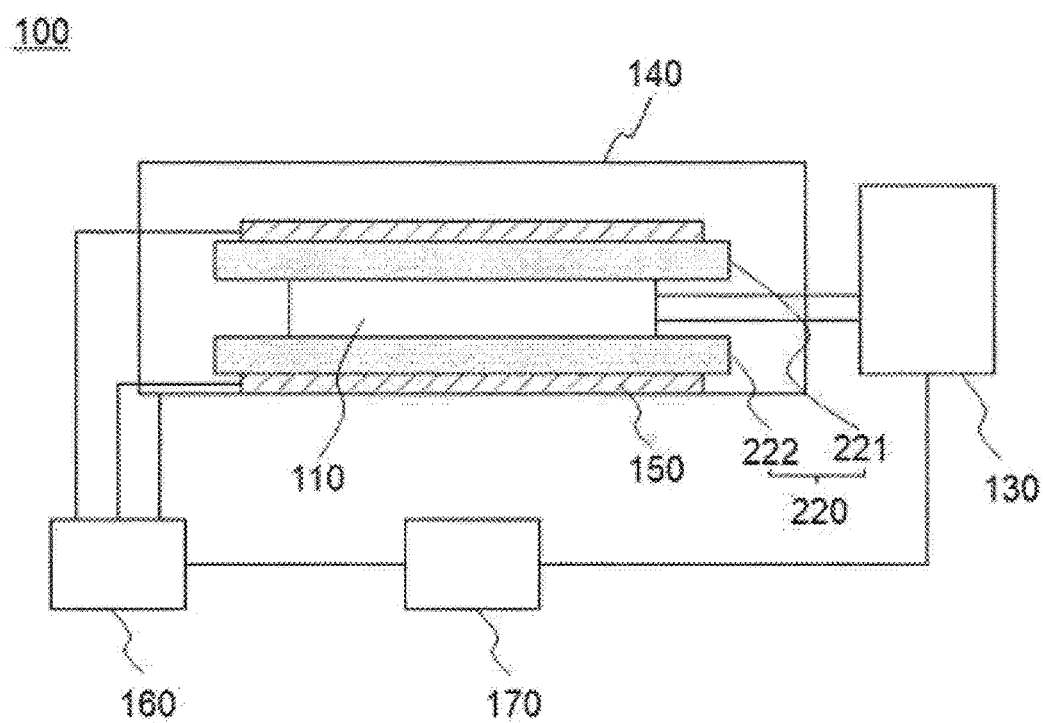

[FIG. 3]
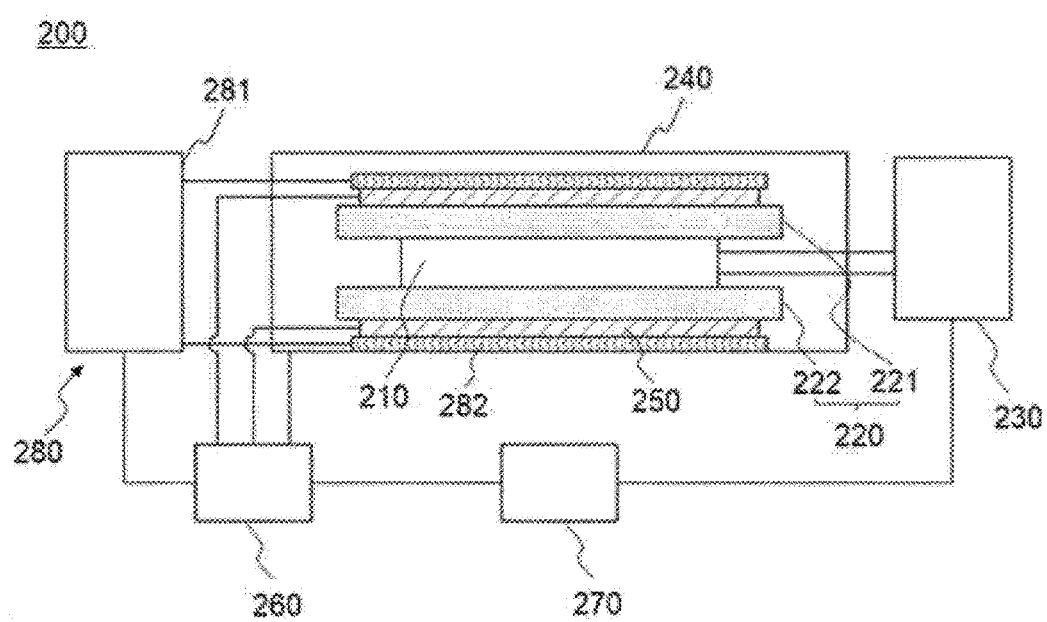

[FIG. 4]
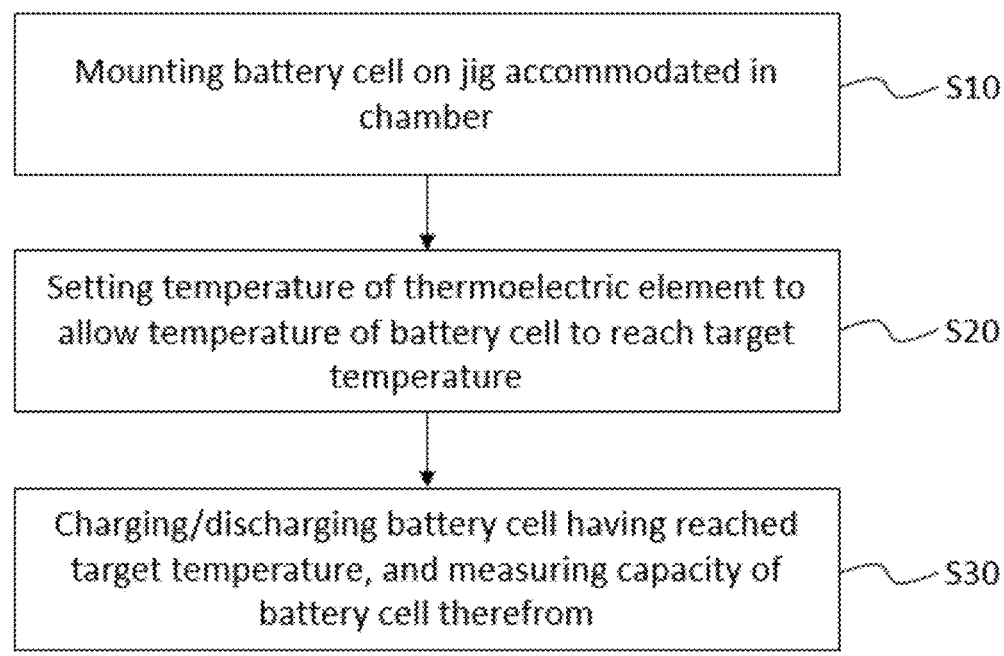

[FIG. 5]
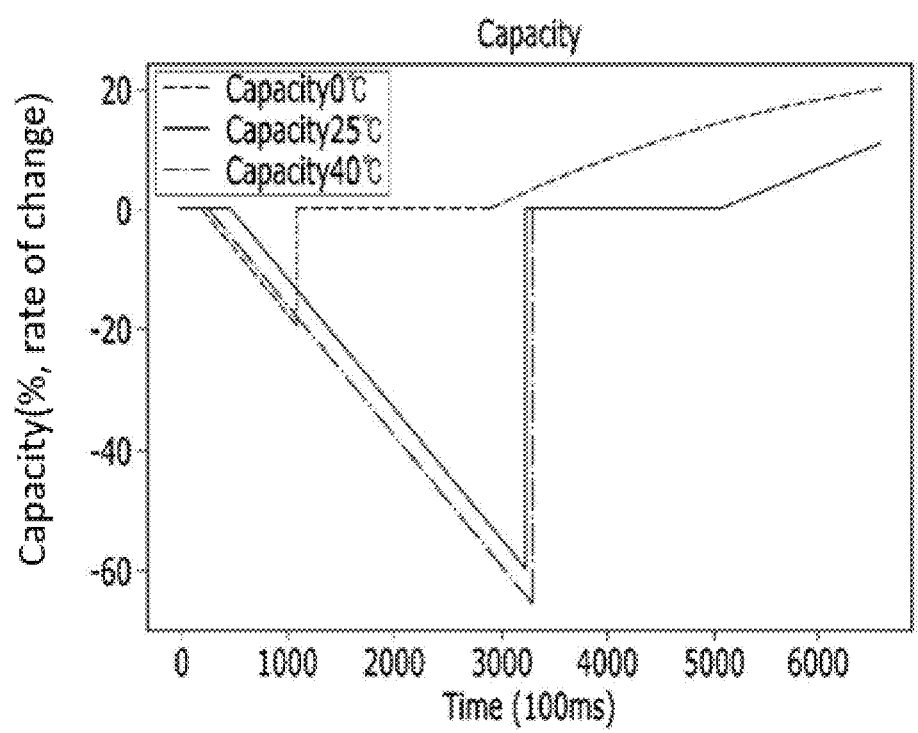

[FIG. 6]
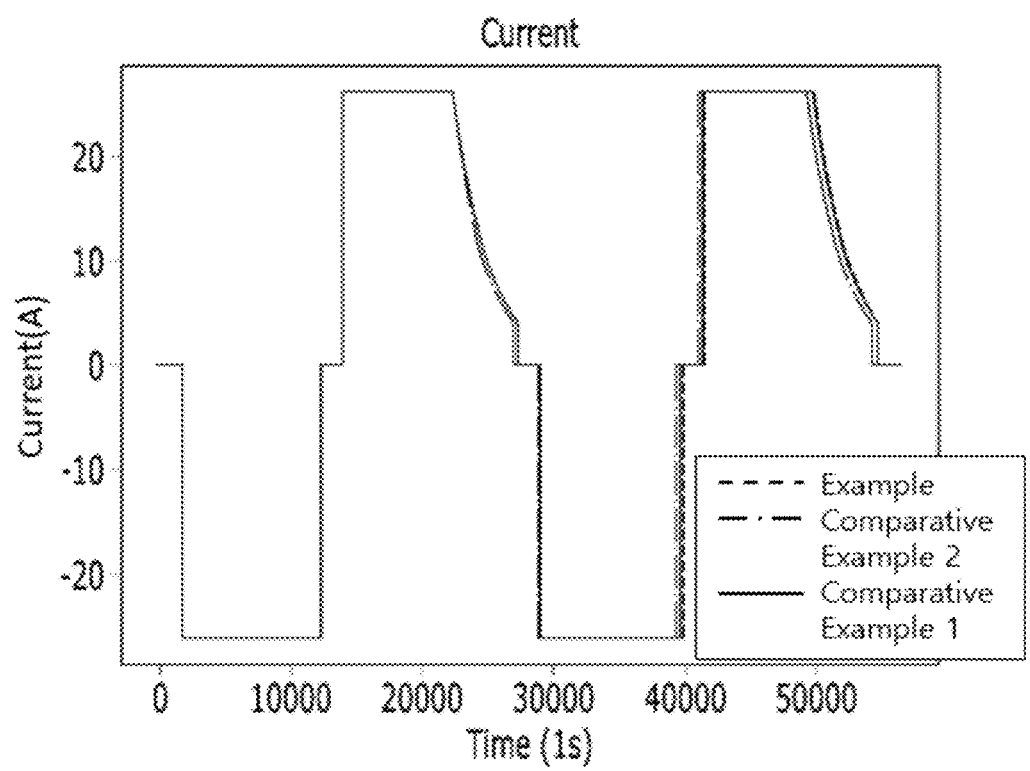

[FIG. 7]
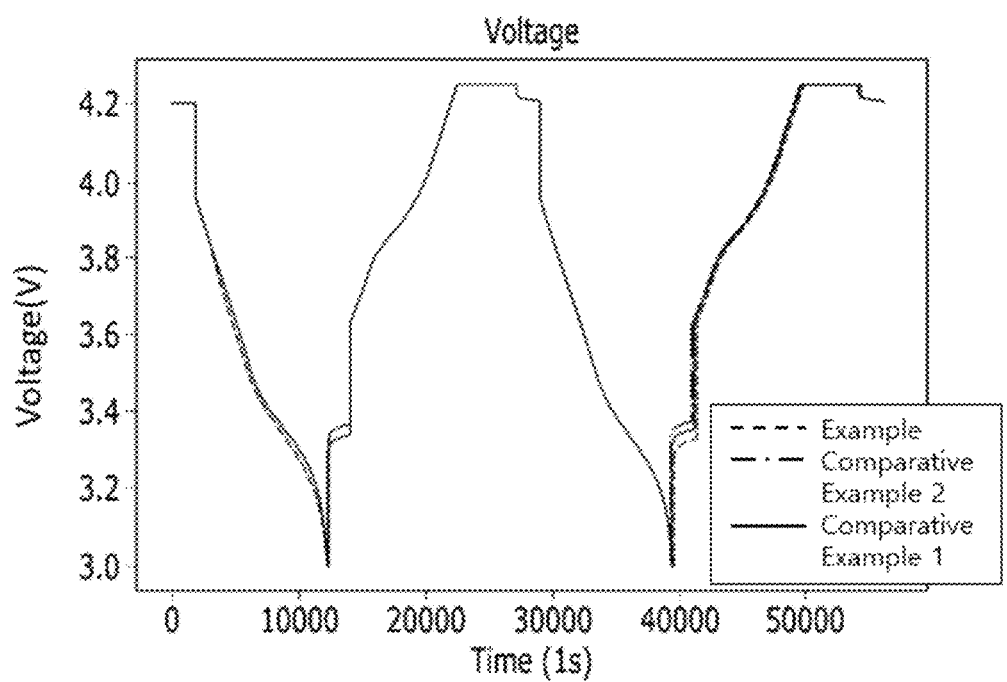

[FIG. 8]
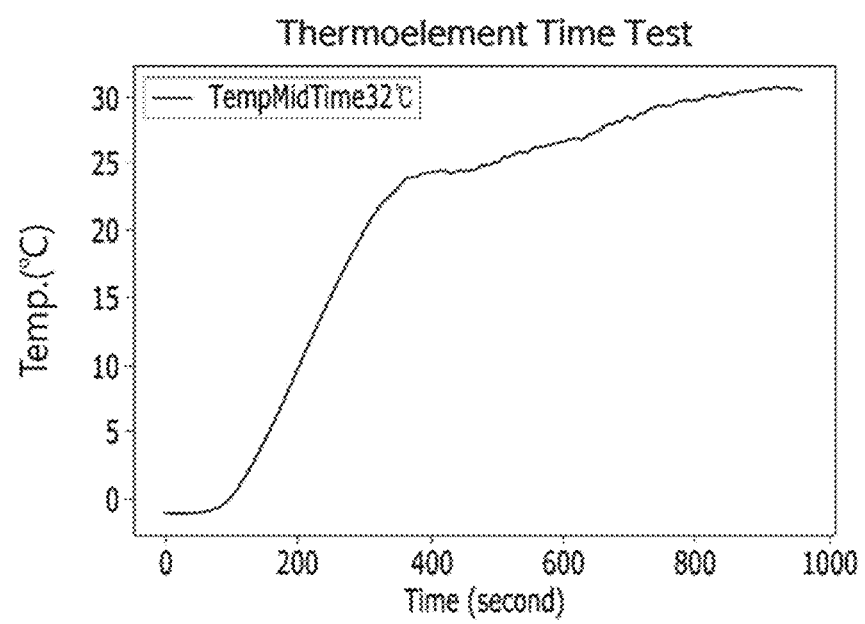

[FIG. 9]
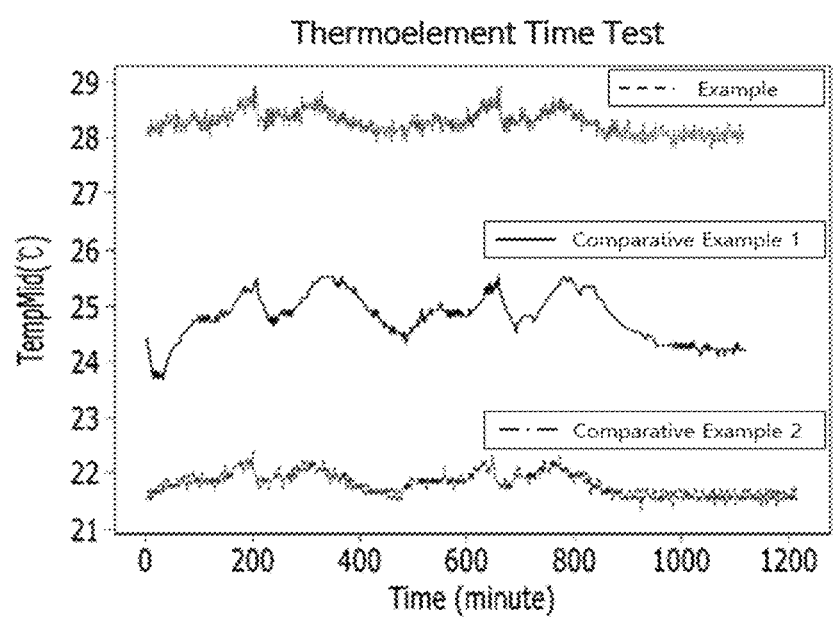

[FIG. 10]
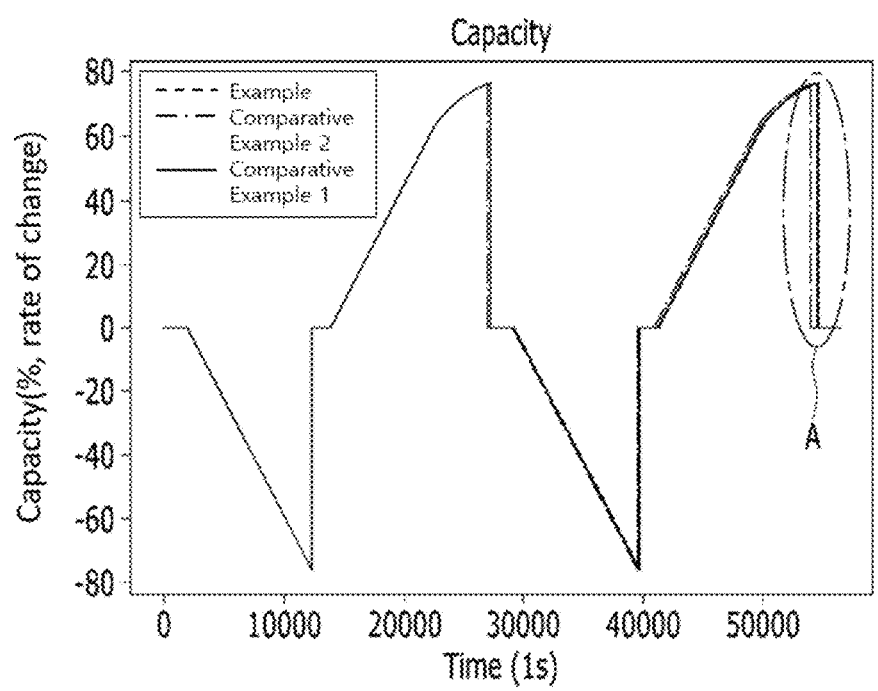

APPARATUS AND METHOD FOR MEASURING CAPACITY OF BATTERY CELL

TECHNICAL FIELD

This application claims the benefit of priority based on Korean Patent Application No. 10-2020-0090055, filed on Jul. 21, 2020, and the entire contents of the Korean patent application are incorporated herein by reference.

The present invention relates to an apparatus and method for measuring the capacity of a battery cell, and more particularly, to an apparatus and method for measuring the capacity of a battery cell using a thermoelectric element.

BACKGROUND ART

Recently, secondary batteries capable of charging and discharging have been widely used as energy sources of wireless mobile devices. In addition, the secondary battery has attracted attention as an energy source of an electric vehicle, a hybrid electric vehicle, etc., which are proposed as a solution for air pollution of existing gasoline vehicles and diesel vehicles using fossil fuel. Therefore, the types of applications using the secondary battery are currently much diversified due to the advantages of the secondary battery, and it is expected that the secondary battery will be applied to many fields and products in the future.

Such secondary batteries may be classified into lithium ion batteries, lithium ion polymer batteries, lithium polymer batteries, etc., depending on the composition of the electrode and the electrolyte, and among them, the amount of use of lithium-ion polymer batteries that are less likely to leak electrolyte and are easy to manufacture is on the increase. In general, secondary batteries are classified into cylindrical batteries and prismatic batteries in which an electrode assembly is embedded in a cylindrical or rectangular metal can, depending on the shape of a battery case, and pouch-type batteries in which the electrode assembly is embedded in a pouch-type case of an aluminum laminate sheet. The electrode assembly built into the battery case is composed of a positive electrode, a negative electrode, and a separator interposed between the positive electrode and the negative electrode, and is a power generating element capable of charging and discharging. The electrode assembly is classified into a jelly-roll type wound with a separator interposed between the positive electrode and the negative electrode which are long sheet-shaped and are coated with active materials, and a stack type in which a plurality of positive electrodes and negative electrodes of a predetermined size are sequentially stacked while a separator is interposed therebetween.

The positive electrode and the negative electrode are formed by applying a positive electrode slurry containing a positive electrode active material and a negative electrode slurry containing a negative electrode active material to a positive electrode current collector and a negative electrode current collector, to thereby form a positive electrode active material layer and a negative electrode active material layer, respectively, followed by drying and rolling them.

In the case of such secondary batteries, defective products are detected, or various performances are evaluated during the manufacturing process, and one representative example of the performances of the secondary battery is the capacity of a battery.

FIG. 1 is a schematic diagram showing a configuration of a conventional battery cell capacity measuring apparatus.

Referring to FIG. 1, a conventional apparatus 10 for measuring the capacity of a battery cell includes a jig 12 on which a battery cell 11 is mounted, a charge/discharge unit 13 for charging and discharging the battery cell, and a charge/discharge chamber 14 for accommodating the battery cell and the jig. The battery cell is repeatedly charged and discharged by the charge/discharge unit, from which the capacity of the battery cell is calculated.

However, there may be a case that the battery cell needs to be charged/discharged at different temperatures before and after measuring the capacity of the battery cell. In this case, the temperature inside the battery cell should be adjusted to a target temperature before the charge/discharge.

At this time, in the conventional apparatus for measuring the capacity of a battery cell, the temperature inside the chamber is generally set to a specific temperature, and a standby status is maintained until the temperature inside the battery cell reaches the temperature inside the chamber. However, long standby time is necessary until the temperature inside the battery cell becomes the same as the temperature inside the chamber. As such, it takes long time in performing a charge/discharge experiment due to the standby time.

Therefore, there is a need for a technology for reducing time required for adjusting the temperature of the inside of the battery cell to a predetermined temperature.

PRIOR ART LITERATURE

Patent Document (Patent Document 1) Korea Patent No. 10-2018-0122116

DISCLOSURE

Technical Problem

The present invention is believed to solve at least some of the above problems. For example, an aspect of the present invention provides an apparatus and method for measuring a capacity of a battery cell capable of reducing time required for adjusting the temperature of the inside of the battery cell to a target temperature at the time of charge/discharge.

Technical Solution

An apparatus for measuring a capacity of a battery cell according to an embodiment of the present invention includes: a jig configured to have a battery cell mounted thereon and press the battery cell from both surfaces; a charge/discharge unit configured to be connected to the battery cell; and a charge/discharge chamber configured to accommodate the jig and the battery cell, wherein a thermoelectric element for adjusting a temperature of the battery cell is formed on an external surface of the jig.

In a specific example, the jig includes: a lower plate on which the battery cell is placed; and an upper plate which presses the battery cell from an upper portion, wherein the thermoelectric element has a plate shape contacting at least one of a lower surface of the lower plate and an upper surface of the upper plate.

At this time, the lower plate and the upper plate are made of a material selected from the group consisting of aluminum and iron.

Further, the apparatus for measuring a capacity of a battery cell according to another embodiment of the present invention further includes a chiller configured to absorb heat discharged from the thermoelectric element.

The chiller includes: a refrigerant supply source which is positioned at an external side of the chamber; and a cooling plate which is connected to the refrigerant supply source at an inside of the chamber, and contacts an external surface of the thermoelectric element.

The apparatus according to the present invention further includes a temperature control unit configured to control operation of the chiller and the temperature of the chamber and the thermoelectric element.

In addition, the apparatus further includes a controller configured to control operation of the temperature control unit and the charge/discharge unit and calculate a capacity of the battery cell.

In addition, the apparatus further includes a temperature sensor which is installed inside the chamber and is disposed to be adjacent to the battery cell.

Further, the present invention provides a method of measuring a capacity of a battery cell by using the above-described apparatus for measuring the capacity of a battery cell, and the method includes: mounting the battery cell on a jig accommodated in a chamber; setting a temperature of a thermoelectric element to allow the battery cell reach a target temperature; and charging and discharging the battery cell having reached the target temperature and measuring a capacity of the battery cell therefrom.

At this time, the temperature of the thermoelectric element is set to be in a temperature range greater than the target temperature by 1 to 10° C.

Herein, the target temperature may be a room temperature.

In addition, the method of measuring the capacity of the battery cell according to the present invention further includes charging and discharging the battery cell at a predetermined temperature before the setting of the temperature of the thermoelectric element.

In addition, the method further includes setting the temperature of the thermoelectric element to allow the temperature of the battery cell reach a temperature in a range that is different from that of the target temperature, and charging and discharging the battery cell.

Advantageous Effects

According to the present invention, it is possible to reduce time required for making the temperature inside the battery cell reach the target temperature by heating or cooling the battery cell through a thermoelectric element by arranging the thermoelectric element, which can heat or cool the battery cell to allow the temperature to be adjusted to a predetermined temperature, on the external surface of the jig which presses the battery cell.

BRIEF DESCRIPTION OF THE DRAWINGS

FIG. 1 is a schematic diagram showing a configuration of a conventional battery cell capacity measuring apparatus.

FIG. 2 is a schematic diagram showing a configuration of a battery cell capacity measuring apparatus according to an embodiment of the present invention.

FIG. 3 is a schematic diagram showing a configuration of a battery cell capacity measuring apparatus according to another embodiment of the present invention.

FIG. 4 is a flowchart illustrating the order of a method of measuring a battery cell capacity according to the present invention.

FIG. 5 is a graph showing battery cell capacities by temperatures.

FIG. 6 is a graph showing changes in the current according to an example and comparative examples in the charge/discharge process when measuring the capacity.

FIG. 7 is a graph showing changes in the voltage according to an example and comparative examples in the charge/discharge process when measuring the capacity.

FIG. 8 is a graph showing time required for a temperature rise of a thermoelectric element in an embodiment according to the present invention.

FIG. 9 is a graph showing the actual temperature inside a battery cell in an example and comparative examples of the present invention.

FIG. 10 is a graph showing the capacity of a battery cell according to an example and comparative examples of the present invention.

DETAILED DESCRIPTION OF THE PREFERRED EMBODIMENTS

Hereinafter, the present invention will be described in detail with reference to the drawings. The terms and words used in the present specification and claims should not be construed as limited to ordinary or dictionary terms and the inventor may properly define the concept of the terms in order to best describe its invention. The terms and words should be construed as meaning and concept consistent with the technical idea of the present invention.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof. Also, when a portion such as a layer, a film, an area, a plate, etc. is referred to as being "on" another portion, this includes not only the case where the portion is "directly on" the another portion but also the case where further another portion is interposed therebetween. On the other hand, when a portion such as a layer, a film, an area, a plate, etc. is referred to as being "under" another portion, this includes not only the case where the portion is "directly under" the another portion but also the case where further another portion is interposed therebetween. In addition, to be disposed "on" in the present application may include the case disposed at the bottom as well as the top.

Hereinafter, the present invention will be described in detail with reference to the drawings.

FIG. 2 is a schematic diagram showing a configuration of a battery cell capacity measuring apparatus according to an embodiment of the present invention.

Referring to FIG. 2, an apparatus 100 for measuring a capacity of a battery cell according to an embodiment of the present invention includes: a jig 120 configured to have a battery cell 110 mounted thereon and press the battery cell 110 from both surfaces; a charge/discharge unit 130 configured to be connected to the battery cell 110; and a charge/discharge chamber 140 configured to accommodate the jig 120 and the battery cell 110, wherein a thermoelectric element 150 for adjusting a temperature of the battery cell is formed on an external surface of the jig 120.

As described above, in order to make the temperature inside the battery cell to be adjusted to a target temperature in a conventional apparatus for measuring the capacity of a battery cell, the temperature inside the chamber accommodating the battery cell had to be set to the target temperature, and a standby status had to be maintained until the temperature inside the battery cell reached the temperature inside the chamber. However, in this case, since the amount of temperature change per hour of the battery cell is about 1 to 2° C. per minute, a long standby time was necessary when the difference between the initial temperature of the battery cell and the target temperature was large.

According to the present invention, it is possible to reduce time required for making the temperature inside the battery cell reach the target temperature by heating or cooling the battery cell through a thermoelectric element by arranging the thermoelectric element, which can heat or cool the battery cell to allow the temperature to be adjusted to a predetermined temperature, on the external surface of the jig which presses the battery cell.

Further, since a thermoelectric element is used as a means for adjusting the temperature in the present invention, the battery may be heated or cooled by one device, and the configuration of the device is simpler than the case that a heat exchange fluid, etc. is used to adjust the temperature.

Hereinafter, the configuration of the apparatus for measuring the capacity of a battery cell according to the present invention will be described in detail.

Referring to FIG. 2, the apparatus 100 for measuring the capacity of a battery cell according to the present invention includes a jig 120 for pressing and fixing a battery cell 110.

There is no limitation on the type of the jig 120 as long as it can press and fix the battery cell 110. For example, a pair of pressing plates may be included to be able to press the battery cell 110 from both sides. In this case, the jig 120 includes: a lower plate 122 on which the battery cell 110 is placed; and an upper plate 121 which presses the battery cell 110 from an upper portion.

Further, the battery cell 110 has a form where an electrode assembly, which has a form that a separator is interposed between a positive electrode and a negative electrode, is accommodated in a battery case. The positive electrode and the negative electrode have a form where an electrode slurry containing an electrode active material is applied on a current collector.

The current collector may be a positive electrode current collector or a negative electrode current collector, and the electrode active material may be a positive electrode active material or a negative electrode active material. In addition, the electrode slurry may further include a conductive material and a binder in addition to the electrode active material.

In the present invention, the positive electrode collector generally has a thickness of 3 to 500 micrometers. The positive electrode current collector is not particularly limited as long as it has high conductivity without causing a chemical change in the battery. Examples of the positive electrode current collector include stainless steel, aluminum, nickel, titanium, sintered carbon or aluminum or stainless steel of which the surface has been treated with carbon, nickel, titanium, silver, or the like. The current collector may have fine irregularities on the surface thereof to increase the adhesion of the positive electrode active material, and various forms such as a film, a sheet, a foil, a net, a porous body, a foam, and a nonwoven fabric are possible.

The sheet for the negative electrode collector generally has a thickness of 3 to 500 micrometers. The negative electrode current collector is not particularly limited as long as it has electrical conductivity without causing chemical changes in the battery, and examples thereof include copper, stainless steel, aluminum, nickel, titanium, sintered carbon, copper or stainless steel of which the surface has been treated with carbon, nickel, titanium, silver or the like, aluminum-cadmium alloy, or the like. In addition, like the positive electrode current collector, fine unevenness can be formed on the surface to enhance the bonding force of the negative electrode active material, and it can be used in various forms such as a film, a sheet, a foil, a net, a porous body, a foam, and a nonwoven fabric.

In the present invention, the positive electrode active material is a material capable of causing an electrochemical reaction and a lithium transition metal oxide, and contains two or more transition metals. Examples thereof include: layered compounds such as lithium cobalt oxide ($LiCoO_2$) and lithium nickel oxide ($LiNiO_2$) substituted with one or more transition metals; lithium manganese oxide substituted with one or more transition metals; lithium nickel oxide represented by the formula $LiNi_{1-y}M_yO_2$ (wherein M=Co, Mn, Al, Cu, Fe, Mg, B, Cr, Zn or Ga and contains at least one of the above elements, $0.01 \leq y \leq 0.7$); lithium nickel cobalt manganese composite oxide represented by the formula $Li_{1+z}Ni_bMn_cCo_{1-(b+c+d)}M_dO_{(2-e)}A_e$ such as $Li_{1+z}Ni_{1/3}Co_{1/3}Mn_{1/3}O_2$, $Li_{1+z}Ni_{0.4}Mn_{0.4}Co_{0.2}O_2$ etc. (wherein $-0.5 \leq z \leq 0.5$, $0.1 \leq b \leq 0.8$, $0.1 \leq c \leq 0.8$, $0 \leq d \leq 0.2$, $0 \leq e \leq 0.2$, $b+c+d<1$, M=Al, Mg, Cr, Ti, Si or Y, and A=F, P or Cl); olivine-based lithium metal phosphate represented by the formula $Li_{1-x}M_{1-y}M'_yPO_{4-z}X_z$ (wherein M=transition metal, preferably Fe, Mn, Co or Ni, M'=Al, Mg or Ti, X=F, S or N, and $-0.5 \leq x \leq 0.5$, $0 \leq y \leq 0.5$, $0 \leq z \leq 0.1$).

Examples of the negative electrode active material include carbon such as non-graphitized carbon and graphite carbon; metal complex oxide such as $Li_xFe_2O_3$ ($0 \leq x \leq 1$), $Li_xWO_2$ ($0 \leq x \leq 1$), $Sn_xMe_{1-x}Me'_yO_z$ (Me:Mn, Fe, Pb, Ge; Me':Al, B, P, Si, groups 1, 2, and 3 of the periodic table, halogen; $0 \leq x \leq 1$; $1 \leq y \leq 3$; $1 \leq z \leq 8$); lithium alloy; silicon alloy; tin alloy; metal oxides such as SnO, $SnO_2$, PbO, $PbO_2$, $Pb_2O_3$, $Pb_3O_4$, $Sb_2O_3$, $Sb_2O_4$, $Sb_2O_5$, GeO, $GeO_2$, $Bi_2O_3$, $Bi_2O_4$, and $Bi_2O_5$; conductive polymers such as polyacetylene; and Li—Co—Ni-based materials.

The conductive material is usually added in an amount of 1 to 30% by weight based on the total weight of the mixture including the positive electrode active material. Such a conductive material is not particularly limited as long as it has electrical conductivity without causing a chemical change in the battery, and examples thereof include graphite such as natural graphite and artificial graphite; carbon black such as carbon black, acetylene black, Ketjen black, channel black, furnace black, lamp black, and summer black; conductive fibers such as carbon fiber and metal fiber; metal powders such as carbon fluoride, aluminum and nickel powder; conductive whiskey such as zinc oxide and potassium titanate; conductive metal oxides such as titanium oxide; and conductive materials such as polyphenylene derivatives and the like.

The binder is added in an amount of 1 to 30% by weight, on the basis of the total weight of the mixture containing the positive electrode active material, as a component that assists in bonding between the active material and the conductive material and bonding to the current collector. Examples of such binders include polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene terpolymer (EPDM), sulfonated EPDM, styrene butylene rubber, fluorine rubber, various copolymers and the like.

The separator is interposed between the positive electrode and the negative electrode, and an insulating thin film having high ion permeability and mechanical strength is used. The pore diameter of the separator is generally 0.01 to 10 micrometers, and the thickness is generally 5 to 300 micrometers. Examples of such a separator include olefin-based polymers such as polypropylene which is chemically resistant and hydrophobic; a sheet or a nonwoven fabric made of glass fiber, polyethylene or the like. When a solid electrolyte such as a polymer is used as the electrolyte, the solid electrolyte may also serve as a separator.

Further, the battery case is not particularly limited as long as it is used as an exterior material for packaging the battery, and a cylindrical, square, or pouch type may be used and specifically a pouch-type battery case may be used. The pouch-type battery case is generally made of an aluminum laminate sheet and may be composed of an inner sealant layer for sealing, a metal layer for preventing permeation of materials, and an external resin layer forming the outermost part of the case. A specific description thereof will be omitted.

Further, the apparatus 100 for measuring the capacity of a battery cell according to the present invention may include a charge/discharge unit 130 for charging and discharging a battery cell 110. A positive electrode tab and a negative electrode tab each is formed on the electrode assembly of the battery cell from the positive electrode and the negative electrode, and a positive electrode lead and a negative electrode lead are connected to the positive electrode tab and the negative electrode tab. The charge/discharge unit 130 may be connected to the positive electrode lead and the negative electrode lead, respectively, to thereby apply predetermined voltage and current to the battery cell.

The battery cell 110 and the jig 120 may be accommodated in the charge/discharge chamber 140. At this time, only the battery cell 110 and the jig 120 are accommodated in the charge/discharge chamber 140, and the charge/discharge unit 130 may be connected to the battery cell 110 at the external side of the charge/discharge chamber 140. In this case, the cable connected to the charge/discharge unit 130 may penetrate the outer wall of the charge/discharge chamber 140 to thereby be connected to the battery cell 110.

The temperature of the battery cell 110 is adjusted by the thermoelectric element 150. A thermoelectric element 150 means an element where heat absorption occurs at one side, and heat generation occurs at the other side, depending on the direction of the current. Namely, in the present invention, both the cooling and heating of the battery cell is performed by the thermoelectric element. As such, it is not necessary to separately prepare a heating device and a cooling device to heat and cool the battery cell, and thus the configuration of a device may become simple.

For example, the output of the battery cell may be measured at 0° C. by charging and discharging the battery cell in a state that the temperature inside the battery cell is 0° C. and using HPPC scheme. At this time, the thermoelectric element may be formed of a bulk structure where N-type thermoelectric materials and P-type thermoelectric materials are connected in series to the electrode after forming thermoelectric materials composed of N-type and p-type semiconductors between metal substrates made of aluminum, etc. or ceramic substrates made of alumina ($Al_2O_3$). Details about the thermoelectric element are known to those of ordinary skill in the art, and thus detailed description thereof will be omitted.

At this time, the thermoelectric element 150 is formed at the external surface of the jig 120. Namely, the thermoelectric element 150 may have a form of a substrate contacting at least one of the lower surface of the lower plate 122 and the upper surface of the upper plate 121. The thermoelectric element 150 may be formed on only one of the lower surface of the lower plate 122 and the upper surface of the upper plate 121, and may be formed on only one of the lower surface of the lower plate 122 and the upper surface of the upper plate 121 as in FIG. 2.

Likewise, by forming the thermoelectric element 150 on the outer surface of the jig 120, the battery cell 110 is indirectly heated or cooled through the upper plate 121 or the lower plate 122 constituting the jig 120 when the thermoelectric element 150 is heated or cooled. To this end, the lower plate 122 and the upper plate 121 may be made of a thermally conductive metal material selected from the group consisting of aluminum and iron.

According to the present invention, it is possible to prevent a rapid temperature change of the battery cell 110 in the vicinity of the surface facing the thermoelectric element 150 by indirectly heating or cooling the battery cell 110 by forming the thermoelectric element 150 on the outer surface of the jig 120. When a temperature control unit such as a thermoelectric element is adjacent to the external surface of the battery cell, the vicinity of the surface where the battery cell contacts the thermoelectric element may be excessively heated or cooled so that the surface may be damaged, or an unexpected response may occur on the surface.

Further, the apparatus 100 for measuring the capacity of a battery cell according to the present invention may further include a temperature control unit 160 for controlling the temperature of the charge/discharge chamber 140 and the thermoelectric element 150. Specifically, the temperature control unit 160 may control the temperature of the air inside the charge/discharge chamber 140 to be within a predetermined temperature range required for charge/discharge. Further, the temperature control unit 160 may maintain the temperature of the inside of the charge/discharge chamber 140 constant.

Further, the temperature control unit 160 may control the temperature of the thermoelectric element 150 to allow the temperature of the inside of the battery cell to reach a target temperature. To this end, the apparatus 100 for measuring the capacity of a battery cell may further include a temperature sensor (not shown). Herein, the temperature sensor is installed, for example, in the charge/discharge chamber 140, and is arranged to be adjacent to the battery cell 110, to thereby be able to sense the temperature inside the battery cell 110. Specifically, the temperature sensor measures the surface temperature of an adjacent battery cell, which may be defined as the temperature of the inside of the battery cell.

If the temperature sensor senses the temperature of the inside of the battery cell, the temperature control unit 160 sets the temperature of the thermoelectric element 150 to a predetermined temperature in order to allow the temperature of the inside of the battery cell to reach a target temperature. The thermoelectric element 150 is heated or cooled until the temperature of the battery cell reaches a target temperature.

Further, the apparatus 100 for measuring the capacity of the battery cell according to the present invention may further include a controller 170 for controlling the operation of the temperature control unit 160 and the charge/discharge unit 130 and calculating the capacity of the battery cell. The controller 170 controls the temperature control unit 160 to allow the temperature of the thermoelectric element 150 reach a predetermined temperature, and controls the charge/discharge unit 130 to charge the battery cell while maintaining the temperature of the inside of the battery cell at a target temperature through the temperature control unit 160 in the case that the temperature of the inside of the battery cell 110 reaches the target temperature. When the charge/ discharge of the battery cell is completed, the controller 170 obtains the charge/discharge profile and calculates the capacity of the battery cell therefrom.

FIG. 3 is a schematic diagram showing a configuration of a battery cell capacity measuring apparatus according to another embodiment of the present invention.

Referring to FIG. 3, an apparatus 200 for measuring a capacity of a battery cell includes: a jig 220 configured to have a battery cell 210 mounted thereon and press the battery cell 210 from both surfaces; a charge/discharge unit 230 configured to be connected to the battery cell 210; and a charge/discharge chamber 240 configured to accommodate the jig 220 and the battery cell 210, wherein a thermoelectric element 250 for adjusting a temperature of the battery cell 210 is formed on an external surface of the jig 220.

As described above, the jig includes: a lower plate 222 on which the battery cell 210 is placed; and an upper plate 221 which presses the battery cell 210 from an upper portion. Herein, the lower plate and the upper plate may be made of a thermally conductive metal material selected from the group consisting of aluminum and iron.

In addition, a thermoelectric element 250 for adjusting a temperature of the battery cell is formed on an external surface of the jig 220, and the thermoelectric element 250 may contact at least one of a lower surface of the lower plate 222 and an upper surface of the upper plate 221.

In addition, the apparatus 200 may further include a chiller 280 configured to absorb heat discharged from the thermoelectric element 250. The chiller 280 serves as a heat sink to absorb heat. The chiller 280 can prevent the thermoelectric element 250 from being overheated and increase the cooling speed at the time of cooling the thermoelectric element 250, and widen the cooling range of the thermoelectric element 250.

There is no particular limitation on the operation of the chiller 280, and both an air-cooled scheme and a water-cooled scheme may be used. However, the water-cooled scheme is preferred for the efficiency of heat exchange. At this time, the chiller 280 includes: a refrigerant supply source 281 which is positioned at an external side of the charge/discharge chamber 240; and a cooling plate 282 which is connected to the refrigerant supply source 281 at an inside of the chamber 240, and contacts an external surface of the thermoelectric element 250. At this time, the cooling plate 282 may be made of a metal material having a high thermal conductivity, such as copper, aluminum, nickel, and iron. The inside of the cooling plate 282 may be connected to the refrigerant supply source 281, and a flow path (not shown), through which a refrigerant moves, may be formed at the inside of the cooling plate 282.

In addition, the apparatus 200 may further include a temperature control unit 260 configured to control operation of the chiller 280 and the temperature of the chamber and the thermoelectric element 250. The temperature control unit 260 may control the temperature of the thermoelectric element 250 to allow the temperature inside the battery cell to reach a target temperature. To this end, a temperature sensor (not shown), which is installed inside the chamber 240 and is disposed to be adjacent to the battery cell, may be further provided. Specifically, the temperature sensor measures the surface temperature of an adjacent battery cell, which may be defined as the temperature of the inside of the battery cell.

If the temperature sensor senses the temperature of the inside of the battery cell, the temperature control unit 260 sets the temperature of the thermoelectric element 250 to a predetermined temperature in order to allow the temperature of the battery cell to reach a target temperature. The thermoelectric element 250 is heated or cooled until the temperature of the battery cell reaches a target temperature. At this time, when cooling the battery cell, the chiller 280 helps the cooling of the battery cell through the thermoelectric element 250.

Further, the battery cell capacity measuring apparatus 200 may further include a controller 270 for controlling the operation of the temperature control unit 260 and the charge/discharge unit 230 and calculating the capacity of the battery cell. The details about the controller are the same as described above.

Further, the present invention provides a method of measuring the capacity of a battery cell by using the above-described apparatus for measuring the capacity of a battery cell.

FIG. 4 is a flowchart illustrating the order of a method of measuring a battery cell capacity according to the present invention.

Referring to FIG. 4, the method of measuring the capacity of the battery cell includes: mounting the battery cell on a jig accommodated in a chamber (S10); setting a temperature of a thermoelectric element to allow the battery cell reach a target temperature (S20); and charging and discharging the battery cell having reached the target temperature and measuring a capacity of the battery cell therefrom (S30).

It is possible to reduce time required for making the temperature inside the battery cell reach the target temperature by heating or cooling the battery cell through a thermoelectric element by arranging the thermoelectric element, which can heat or cool the battery cell to allow the temperature to be adjusted to a predetermined temperature, on the external surface of the jig which presses the battery cell.

Further, since a thermoelectric element is used as a means for adjusting the temperature in the present invention, the battery may be heated or cooled by one device, and the configuration of the device is simpler than the case that a heat exchange fluid, etc. is used to adjust the temperature.

Hereinafter, a method of measuring a capacity of a battery cell according to the present invention will be described in detail.

First, a battery cell is mounted on a jig accommodated in a chamber. The above-described pouch-type battery cell may be used as the battery cell. If the battery cell is mounted on a jig in the chamber, the temperature of the chamber is maintained constant in a state that the chamber is closed and sealed. Further, the temperature sensor may be installed to be adjacent to the battery cell.

When the battery cell is mounted, the temperature of the thermoelectric element is set to allow the temperature of the battery cell to reach a target temperature. Herein, the target temperature to be reached by the battery cell refers to the temperature of the inside of the battery cell. The temperature of the thermoelectric element may be set through the above-described controller and temperature control unit.

At this time, the temperature of the thermoelectric element, which is set by the controller and the temperature control unit, is preferably set to be higher than the target temperature. This is because in the apparatus for measuring the capacity according to the present invention, the thermoelectric element heats or cools the battery cell via the jig in a state that is positioned on the external surface of the jig, and thus the internal temperature of the battery cell becomes lower than the temperature of the thermoelectric element.

Specifically, the temperature of the thermoelectric element may be set to be in a temperature range greater than the target temperature by 1 to 10° C., and specifically in a temperature range greater than the target temperature by 3 to 7° C. When the temperature range of the thermoelectric element is set as described above, the temperature of the inside of the battery cell may reach the target temperature. In the case that the temperature of the thermoelectric element is set to be the same as the target temperature, the actual internal temperature of the battery cell may be smaller than the target temperature, and the capacity of the battery cell measured in this case may be smaller than the capacity of the battery cell at the target temperature. In particular, if the internal temperature of the chamber is lower than the target temperature, the temperature of the thermoelectric element may be set to be higher than the target temperature.

If it is confirmed than that the internal temperature of the battery cell has reached the target temperature through the thermoelectric element, the battery cell is charged and discharged. At this time, the battery cell may be charged by applying the constant current. Specifically, the process of charging the battery cell to a predetermined C-rate, and discharging the battery cell to a predetermined C-rate after a certain period of resting time when the voltage of the battery cell reaches the termination voltage may be repeated. It is possible to obtain the charge/discharge profile according to time of the battery cell therefrom, and it is possible to measure the capacity from the amount discharged or charged per hour.

At this time, the charging speed of the battery cell may be the same as the discharging speed of the battery cell. Specifically, at the time of charge/discharge, the C-rate may be 0.1 to 0.7 C, specifically 0.3 to 0.5 C. When the C-rate is less than the above range, it may take long time because the charge/discharge speed is low, and when the C-rate exceeds the above range, an error may be generated due to deterioration of the battery because the charge/discharge speed is too high.

Further, when measuring the capacity, the target temperature is preferably a room temperature. FIG. 5 is a graph showing time which is spent in the temperature rise of the thermoelectric element according to an embodiment of the present invention. Referring to FIG. 5, the capacity measurement values are changed according to the temperature for the same battery cell. However, as shown in FIG. 5, in the case of the capacity measured at 0° C., the pattern is different, and the actual battery cell is mostly used in a room temperature condition. Hence, the capacity measured in the room temperature may be determined as the capacity of the battery cell according to the present invention.

Further, according to the method of measuring the capacity of a battery cell of the present invention, the performance of the battery may be measured by charging and discharging the battery cell at different temperatures before measuring the capacity. Specifically, the method of measuring the capacity of the battery cell may further include charging and discharging the battery cell at a predetermined temperature before the setting of the temperature of the thermoelectric element. Specifically, it is possible to repeat the charge/discharge at different temperatures of the battery cell before measuring the capacity and evaluate other characteristics of the battery cell. Some example of other characteristics of the battery cell may include output characteristics or lifespan characteristics of the battery cell. At this time, the temperature inside the battery cell may be adjusted by cooling or heating the battery cell or adjusting the temperature of the chamber to a temperature to a target temperature through a thermoelectric element.

For example, the battery cell may be charged and discharged in a state that the internal temperature of the battery cell is at 0° C., and the output of the battery cell may be measured at 0° C. by using the HPPC scheme. At this time, it is possible to cool the battery cell by using a thermoelectric element in order to adjust the temperature inside the battery cell to 0° C., or it is possible to perform charge/discharge in a state that the temperature of the chamber is at 0° C.

In this case, after the step of charging and discharging the battery cell at a predetermined temperature, the temperature inside the battery cell is adjusted to a target temperature (e.g., a room temperature) in order to measure the capacity of the battery cell. According to the method of measuring the capacity of a battery cell of the present invention, time, which is spent until the temperature inside the battery cell reaches the target temperature, may be reduced by using a thermoelectric element in order to measure the capacity of the battery cell.

Further, according to the method of measuring the capacity of a battery cell of the present invention, the performance of the battery may be measured by charging and discharging the battery cell at different temperatures after measuring the capacity. Specifically, the method of measuring the capacity of the battery cell according to the present invention may further include setting the temperature of the thermoelectric element to allow the temperature of the battery cell reach a temperature in a range that is different from that of the target temperature, and charging and discharging the battery cell. Even in this case, the temperature of the battery cell is adjusted by using the thermoelectric element. As such, it is possible to reduce the time that takes until the temperature inside the battery cell reaches a target temperature.

Meanwhile, the internal temperature of the chamber may be maintained constant during these series of charge/discharge processes.

DETAILED DESCRIPTION OF THE PREFERRED EMBODIMENTS

Hereinafter, the present invention will be described in detail with reference to examples. However, the embodiments according to the present invention may be modified into various other forms, and the scope of the present invention should not be construed as being limited to the examples described below. The examples of the present invention are provided to more fully describe the present invention to those skilled in the art.

Preparation Example

A positive electrode mixture was prepared by mixing 96.7 parts by weight of $Li[Ni_{0.6}Mn_{0.2}Co_{0.2}]O_2$ serving as a positive electrode active material, 1.3 parts by weight of graphite serving as a conductive material, and 2.0 parts by weight of polyvinylidene fluoride (PVdF) serving as a binder. The positive electrode slurry was prepared by dispersing the obtained positive electrode mixture in 1-methyl-2-pyrrolidone functioning as a solvent. A positive electrode was prepared by coating, drying, and pressing the slurry on both sides of an aluminum foil having a thickness of 20 μm, respectively.

A negative electrode mixture was prepared by mixing 97.6 parts by weight of artificial graphite and natural graphite that function as negative electrode active materials (weight ratio: 90:10), 1.2 parts by weight of styrene-butadiene rubber (SBR) that functions as a binder, and 1.2 parts by weight of carboxymethyl cellulose (CMC). The negative electrode slurry was prepared by dispersing the negative electrode mixture in ion-exchanged water functioning as a solvent. A negative electrode was prepared by coating, drying, and pressing the slurry on both sides of an copper foil having a thickness of 20 μm.

A non-aqueous electrolyte solution was prepared by dissolving $LiPF_6$ in an organic solvent, in which ethylene carbonate (EC), propylene carbonate (PC), and diethyl carbonate (DEC) were mixed in a composition of 3:3:4 (volume ratio). Herein, $LiPF_6$ was dissolved in the organic solvent to be a concentration of 1.0M.

A battery cell was prepared by laminating a porous polyethylene separator between the positive electrode and the negative electrode prepared above and storing them in a pouch, and then injecting the electrolyte solution.

Example

The battery cell was mounted on the capacity measuring apparatus. Specifically, the battery cell was mounted on the jig inside the chamber, and the chamber was sealed. At this time, the temperature of the chamber was set to 0° C.

In this state, hybrid pulse power characterization (HPPC) method was used to charge and discharge the battery cell, and the output characteristics were measured. Specifically, the charge/discharge was performed while applying current in a pulse form, the resistance values were obtained from the voltage change during the charge/discharge, and the output was measured therefrom.

Thereafter, in the state that the temperature of the chamber is maintained, the capacity was measured in a room temperature (25° C.). Namely, the target temperature was set to a room temperature when measuring the capacity. Measuring the capacity at a room temperature means setting the temperature of the inside of the battery cell to a room temperature and measuring the capacity. At this time, the temperature of the thermoelectric element was set to 32° C., which was higher than the target temperature, to heat the battery cell, and a standby status was maintained until the temperature inside the battery cell reached the target temperature. Thereafter, when internal temperature of the battery cell reaches a target temperature, the capacity was measured through the charge/discharge. At this time, the battery cell was charged and discharged by repeating the process of charging the battery cell to ⅓C as in FIG. 6, discharging the battery cell to ⅓C after a 30 minute resting time when the voltage of the battery cell reaches the termination voltage, and again maintaining another 30 minute resting time. As a result, the voltage changes of the battery cell are shown in FIG. 7.

When the charge/discharge was completed, the discharge profile was obtained, and the capacity of the battery cell was calculated from the discharge profile.

Thereafter, the battery cell was cooled by setting the temperature of the thermoelectric element to 0° C., and the charge/discharge was performed.

Comparative Example 1

The battery cell was mounted on the jig inside the chamber, and the chamber was sealed. At this time, the temperature of the chamber was set to 0° C.

In this state, hybrid pulse power characterization (HPPC) method was used to charge and discharge the battery cell, and the output characteristics were measured. The measurement method was the same as in Example.

Thereafter, the temperature of the chamber was risen to the target temperature (room temperature, 25° C.), and a standby status was maintained until the temperature inside the battery cell reached the target temperature. When the temperature inside the battery cell reaches the target temperature, the capacity of the battery cell was measured in the same manner as in Example.

Thereafter, the temperature of the chamber was set to 0° C., and a standby status was maintained until the temperature inside the battery cell reached 0° C. When the temperature inside the battery cell reaches 0° C., the charge/discharge was performed in the same manner as in Example.

Comparative Example 2

An experiment was performed in the same manner as in the example except that the temperature of the thermoelectric element was set to be the same as the target temperature (room temperature, 25° C.) when measuring the capacity of the battery cell.

Experimental Example 1

Time required for each step was recorded for the example and the comparative example 1. Specifically, 1) time that takes until the temperature of the chamber or the thermoelectric element reaches a preset temperature for heating or cooling the battery cell, 2) time that takes until the internal temperature of the battery cell reaches the target temperature, 3) time that takes until the temperature of the chamber or the thermoelectric element is set to 0° C. after measuring the capacity, and 4) time that takes until the temperature of the battery cell reaches 0° C. were recorded. The results are shown in Table 1. Further, FIG. 8 shows time which is spent until the temperature of the thermoelectric element reaches a reset temperature (32° C.).

TABLE 1

| Division | Example (min) | Comparative example 1 (min) |
|---|---|---|
| Chamber or thermoelectric element setting temperature reaching time | 16 | 25 |
| Battery cell inside target temperature reaching time (Soaking process) | 30 | 120 |
| Chamber or thermoelectric element setting temperature reaching time | 20 | 40 |
| Battery cell inside target temperature reaching time (Soaking process) | 30 | 120 |
| Total | 96 | 305 |

Referring to Table 1 and FIG. 8, less time was required in the case of an example of using a thermoelectric element, compared to the comparative example 1. This is because the time, which takes until the temperature of the thermoelectric element reaches a preset temperature, is shorter than time that takes until the temperature of the chamber reaches the preset temperature, and when using the thermoelectric element, heat may be directly transferred to the inside of the battery cell, and thus time that takes until the temperature inside the battery cell reaches the target temperature gets short.

Experimental Example 2

During the capacity measuring process, the surface temperature of the side surface of the battery cell was measured using a temperature sensor. Specifically, the result is shown in FIG. 9.

The capacities measured during the capacity measuring process are shown in FIG. 10.

Referring to FIGS. 9 and 10, in the case of the comparative example 2 where the temperature of the thermoelectric element was set to be the same as the target temperature, the actual temperature of the battery cell was made to be lower than the target temperature, and as a result, the capacity was measured as a value which was reduced than the actual capacity (part A). On the other hand, when the temperature of the thermoelectric element was set to be higher than the target temperature as in the example, the actual temperature of the battery cell was a value close to the target temperature, and the capacity of the battery cell was the same as the case that the temperature of the battery cell was 25° C.

The above description is merely illustrative of the technical idea of the present invention, and those skilled in the art to which the present invention pertains may make various modifications and variations without departing from the essential characteristics of the present invention. Therefore, the drawings disclosed in the present invention are not intended to limit the technical idea of the present invention but to describe the present invention, and the scope of the technical idea of the present invention is not limited by these drawings. The scope of protection of the present invention should be interpreted by the following claims, and all technical ideas within the scope equivalent thereto should be construed as being included in the scope of the present invention.

On the other hand, in this specification, terms indicating directions such as up, down, left, right, before, and after are used, but it is obvious that these terms are for convenience of description only and may change depending on the location of the object or the location of the observer.

DESCRIPTION OF REFERENCE NUMERALS 10, 100, 200: apparatus for measuring a capacity of a battery cell
11, 110, 210: battery cell
12, 120, 220: jig
13, 130, 230: charge/discharge unit
14, 140, 240: charge/discharge chamber
121, 221: upper plate
122, 222: lower plate
150, 250: thermoelectric element
160, 260: temperature control unit
170, 270: controller
280: chiller
281: refrigerant supply source
282: cooling plate

The invention claimed is:

1. An apparatus for measuring a capacity of a battery cell, the apparatus comprising:
a jig configured to have the battery cell mounted thereon and press the battery cell from both surfaces;
a chamber configured to accommodate the jig and the battery cell;
a thermoelectric element for adjusting a temperature of the battery cell disposed on an external surface of the jig such that the thermoelectric element is configured to overlap the battery cell from a first end of the battery cell to a second end of the battery cell entirely and continuously;
a chiller configured to absorb heat discharged from the thermoelectric element, the chiller including:
a refrigerant supply source at an external side of the chamber; and
a cooling plate connected to the refrigerant supply source at an inside of the chamber, and contacting an external surface of the thermoelectric element; and
a charge/discharge unit configured to be connected to the battery cell via the first end or the second end.

2. The apparatus of claim 1, wherein the jig includes:
a lower plate on which the battery cell is configured to be placed; and
an upper plate configured to press the battery cell from an upper portion,
wherein the thermoelectric element has a plate shape contacting at least one of a lower surface of the lower plate and an upper surface of the upper plate.

3. The apparatus of claim 2, wherein the lower plate and the upper plate include a material selected from the group consisting of aluminum and iron.

4. The apparatus of claim 1, wherein the thermoelectric element is configured to overlap the battery cell from a first end of the battery cell to a second end of the battery cell without any gap in between.

5. The apparatus of claim 2, wherein the lower plate is configured to overlap the battery cell from a first end of the battery cell to a second end of the battery cell gaplessly and entirely.

6. The apparatus of claim 1, further comprising a temperature control unit configured to control operation of the chiller, a temperature of air inside the charge/discharge unit, and the temperature of the chamber and the thermoelectric element.

7. The apparatus of claim 1, further comprising a temperature sensor inside the chamber and disposed to be adjacent to the battery cell.

8. The apparatus of claim 6, further comprising a controller configured to control operation of the temperature control unit and the charge/discharge unit and calculate a capacity of the battery cell.

9. A method of measuring a capacity of a battery cell by using the apparatus according to claim 1, the method comprising:
mounting the battery cell on the jig accommodated in the chamber;
setting a temperature of the thermoelectric element to allow the battery cell reach a target temperature; and
charging and discharging the battery cell having reached the target temperature and measuring a capacity of the battery cell therefrom.

10. The method of claim 9, wherein the temperature of the thermoelectric element is set to be in a temperature range greater than the target temperature by 1 to 10° C.

11. The method of claim 9, wherein the target temperature is a room temperature.

12. The method of claim 11, further comprising charging and discharging the battery cell at a predetermined temperature before the setting of the temperature of the thermoelectric element.

13. The method of claim 9, further comprising setting the temperature of the thermoelectric element to allow the temperature of the battery cell reach a temperature in a range that is different from that of the target temperature, and charging and discharging the battery cell.

14. The apparatus of claim 1, wherein the chamber is configured to be closed and sealed.

15. The apparatus of claim 2, wherein the thermoelectric element contacts both the lower surface of the lower plate and the upper surface of the upper plate.

16. The apparatus of claim 1, wherein the cooling plate directly contacts the external surface of the thermoelectric element.

17. The method of claim 10, wherein the temperature of the thermoelectric element is set to be in a temperature range greater than the target temperature by 3 to 7° C.

18. The method of claim 10, wherein an internal temperature of the chamber is lower than the target temperature.

* * * * *